United States Patent
Kim et al.

(10) Patent No.: US 7,810,635 B2
(45) Date of Patent: Oct. 12, 2010

(54) SUBSTRATE TRANSFER APPARATUS AND METHOD OF DRIVING THE SAME

(75) Inventors: Seong-Ku Kim, Bucheon-si (KR); Jong-Eok Ban, Seongnam-si (KR)

(73) Assignee: Samsung Techwin Co., Ltd., Changwon-si (KR)

( * ) Notice: Subject to any disclaimer, the term of this patent is extended or adjusted under 35 U.S.C. 154(b) by 365 days.

(21) Appl. No.: 11/974,763

(22) Filed: Oct. 16, 2007

(65) Prior Publication Data

US 2008/0092680 A1   Apr. 24, 2008

(30) Foreign Application Priority Data

Oct. 24, 2006   (KR) ...................... 10-2006-0103640

(51) Int. Cl.
*B65G 15/10* (2006.01)
(52) U.S. Cl. ...................... 198/817; 198/604; 198/465.1
(58) Field of Classification Search .................. 198/817, 198/465.1, 604
See application file for complete search history.

(56) References Cited

U.S. PATENT DOCUMENTS

| | | | | |
|---|---|---|---|---|
| 4,631,812 A | * | 12/1986 | Young | 29/714 |
| 4,823,940 A | * | 4/1989 | Cretser | 198/817 |
| 5,259,495 A | * | 11/1993 | Douglas | 198/404 |
| 5,368,643 A | * | 11/1994 | Kuster | 118/324 |
| 6,012,568 A | * | 1/2000 | Kane | 198/817 |
| 6,032,788 A | * | 3/2000 | Smithers et al. | 198/817 |
| 6,082,526 A | * | 7/2000 | Baker et al. | 198/817 |
| 6,142,293 A | * | 11/2000 | Ozawa et al. | 198/837 |
| 6,247,581 B1 | * | 6/2001 | Oswald et al. | 198/812 |
| 6,378,198 B1 | * | 4/2002 | Asai et al. | 29/825 |
| 6,769,534 B2 | * | 8/2004 | Lee | 198/817 |
| 6,892,446 B2 | * | 5/2005 | Hwang et al. | 29/740 |
| 6,988,612 B1 | * | 1/2006 | Kabeshita et al. | 198/817 |
| 7,036,656 B2 | * | 5/2006 | Gariglio | 198/689.1 |
| 7,571,801 B2 | * | 8/2009 | Bavelloni | 198/817 |

FOREIGN PATENT DOCUMENTS

| JP | 8-008594 A | 1/1996 |
|---|---|---|
| JP | 10-181862 A | 7/1998 |

* cited by examiner

*Primary Examiner*—Joe Dillon, Jr.
(74) *Attorney, Agent, or Firm*—Drinker Biddle & Reath LLP

(57) ABSTRACT

A substrate transfer apparatus and a method of driving the same includes a first guide block and a second guide block, and a single ball screw shaft connected to the first and second guide blocks moves the guide blocks in an axial direction thereof. A first drive unit rotates the ball screw shaft to concurrently move the pair of guide blocks, and a second drive unit connected to the second guide block separately moves the second guide block with respect to the first guide block.

12 Claims, 7 Drawing Sheets

SUBSTRATE TRANSFER APPARATUS AND METHOD OF DRIVING THE SAME

CROSS-REFERENCE TO RELATED APPLICATION

This application claims the benefit of Korean Patent Application No. 2006-103640, filed Oct. 24, 2006, the disclosure of which is hereby incorporated herein by reference in its entirety.

BACKGROUND OF THE INVENTION

1. Field of the Invention

The present invention relates to a substrate transfer apparatus and a method of driving the same, and more particularly, to a substrate transfer apparatus and a method of driving the same capable of moving a plurality of guide rails and adjusting a gap therebetween using a single ball screw shaft.

2. Description of the Related Art

A known apparatus for mounting components on a printed circuit board includes a base frame, an X-Y gantry, a component suction device, a substrate transfer device, a component supply device, and so on. The X-Y gantry is assembled on the base frame to move the component suction device in X and Y axis directions.

The component suction device is disposed on the X-Y gantry and is thereby moved to mount components supplied through the component supply device on the printed circuit board. The printed circuit board, on which the components are mounted, is transferred to a component mounting position by the substrate transfer device.

Hereinafter, a conventional substrate transfer apparatus 10 will be described in detail with reference to FIGS. 1 and 2.

The substrate transfer apparatus 10 includes a pair of guide blocks 20, a first ball screw shaft 30, a second ball screw shaft 40, a first drive unit 34, a second drive unit 44, and a base frame 52.

The guide blocks 20 include a first guide block 21 and a second guide block 22. Each of the guide blocks 20 includes a guide rail support frame 23 and a guide rail 24. The guide rail 24 is mounted on the guide rail support frame 23. A conveyor belt 26, on which one side of a printed circuit board 28 is seated, is disposed on an upper surface of the guide rail 24. The conveyor belt 26 may be driven by a roller (not shown) disposed on the guide rail 24.

The first ball screw shaft 30 passes through the guide rail support frame 23 and is rotated by the first drive unit 34. The first drive unit 34 is fixed to a guide rail support frame 23a of the first guide block 21 by a bracket 35, and connected to one end of the first ball screw shaft 30 to be driven by a motor.

A first ball screw nut 32 may be installed at a through-hole (not shown) of a guide rail support frame 23b connected to the first ball screw shaft 30. That is, the first ball screw nut 32 may include an inner periphery having a female threaded part corresponding to a male threaded part formed on an outer periphery of the first ball screw shaft 30.

Similar to the first ball screw shaft 30, the second ball screw shaft 40 also passes through the guide rail support frame 23 and is rotated by the second drive unit 44. The second drive unit 44 is supported by a bracket 54 fixed to the base frame 52 disposed under the second drive unit 44. The second drive unit 44 may be connected to one end of the second ball screw shaft 40 to be rotated by a motor.

A second ball screw nut 42 is installed at a through-hole (not shown) of the guide rail support frame 23a connected to the second ball screw shaft 40. That is, the second ball screw nut 42 may include an inner periphery having a female threaded part corresponding to a male threaded part formed at an outer periphery of the second ball screw shaft 40.

Here, the second ball screw shaft 40 can be rotatably supported by a first support frame 56 and a second support frame 58 via ball bearings (not shown) disposed in the support frames 56 and 58.

The guide blocks 20 are connected to the base frame 52 by a connection bar 70 having a connection piece 72. A reference rail 60 is installed at the base frame 52 to guide movement of the connection bar 70. Specifically, a reference piece 62 formed at the reference rail 60 slidably engages a groove formed in the connection piece 72 so that the guide blocks 20 can move along the reference rail 60.

Hereinafter, position movement of the substrate transfer apparatus 10 will be described.

First, the second ball screw shaft 40 is rotated by the second drive unit 44 while the first drive unit 34 does not operate. The second ball screw shaft 40 engages the second ball screw nut 42 to move the guide blocks 20.

That is, the guide blocks 20 can only horizontally move while maintaining a certain width therebetween.

FIG. 2 illustrates the known substrate transfer apparatus, in which the first ball screw shaft 30 projects outward due to movement and width adjustment of the guide blocks 20. As shown in FIG. 2, it is possible to freely vary the position where the printed circuit board 28 can be supplied through the second drive unit 44.

Meanwhile, variation in size of the printed circuit board 28 requires varying the width W between the guide blocks 20. In this case, the first drive unit 34 operates while the second drive unit 44 stops.

The operation of the first drive unit 34 causes rotation of the first ball screw shaft 30. The first ball screw shaft 30 and the first ball screw nut 32 engage each other to move the second guide block 22, thereby varying the width W between the guide blocks 20.

As described above, the known substrate transfer apparatus 10 can adjust the position of the guide blocks 20 and the width W between the guide blocks 20 using the ball screw shafts 30 and 40, thereby supplying various printed circuit boards 28 having different widths.

A disadvantage of using the plurality of ball screw shafts 30 and 40 in the known substrate transfer apparatus 10 is an increase in manufacturing cost. In addition, referring to portion "A" of FIG. 2, during the process of adjusting the position and the width W of the guide blocks 20, the first ball screw shaft 30 may project beyond the base frame 52 such that a marginal space should be provided in the component mounting device.

An additional disadvantage is that the excessive projection of the first ball screw shaft 30 may cause portion "A" of the shaft 30 to be unsupported, and thus normal operation at the connection part with the guide blocks 20 may not be performed.

SUMMARY OF THE INVENTION

In accordance with an aspect of the invention, a substrate transfer apparatus and a method of driving the same may be simplified using a single ball screw shaft to displace a plurality of guide blocks and to a change a gap therebetween.

In accordance with one aspect of the invention, there may be provided a substrate transfer apparatus that includes a pair of guide blocks including a first guide block and a second guide block facing the first block; a ball screw shaft is connected to the guide blocks to move the guide blocks in an axial direction thereof; a first drive unit is connected to one end of the ball screw shaft to rotate the ball screw shaft to thereby concurrently move the pair of guide blocks; and a second drive unit is connected to the second guide block to separately move the second guide block with respect to the first guide block.

In accordance with another aspect, a first driven pulley may be connected to one end of the ball screw shaft, and the first drive unit may include a first motor, a first drive pulley connected to the first motor, and a first power transmission belt for transmitting power from the first drive pulley to the first driven pulley.

In accordance with still another aspect, the first guide block may include a first conveyor belt on which one side of a substrate is disposed, a first guide rail on which the first conveyor belt is rotatably supported, and a first ball screw nut fixed with respect to the first guide rail and having a female threaded part engaging a male threaded part formed on the ball screw shaft.

In accordance with yet another aspect, the second guide block may include a second conveyor belt on which another side of the substrate is disposed, a second guide rail on which the second conveyor belt is rotatably supported, a rotary part having a through-hole to engage the ball screw shaft, and a bearing connection part for connecting the second guide rail with the rotary part to thereby rotatably support the rotary part, wherein the second drive unit rotates the rotary part to move the second guide block.

In accordance with yet another aspect, the bearing connection part may be an angular bearing.

In accordance with yet another aspect, the rotary part may include a second driven pulley for receiving power from the second drive unit, a second ball screw nut having a female threaded part engaging a male threaded part formed on the ball screw shaft, and a housing for fixedly connecting the second driven pulley with the second ball screw nut.

In accordance with another aspect of the present invention, there may be provided a substrate transfer apparatus that includes a first guide rail on which a first conveyor belt disposed on one side of a substrate is rotatably supported, a first ball screw nut is fixed to the first guide rail, a ball screw shaft is inserted into the first ball screw nut and threadably engages the first ball screw nut to move the first guide rail in an axial direction during rotation thereof, a second guide rail spaced apart from the first guide rail and on which a second conveyor belt disposed on the other side of the substrate is rotatably supported, a second ball screw nut rotatably disposed with respect to the second guide rail and engaging the ball screw shaft to move in an axial direction of the ball screw shaft when the ball screw shaft is rotated, a first drive unit connected to the ball screw shaft to rotate the ball screw shaft, and a second drive unit connected to the second ball screw nut to rotate the second ball screw nut.

In accordance with another aspect, the substrate transfer apparatus may further include a bearing connection part disposed between the second guide rail and the second ball screw nut to rotatably support the second guide rail with respect to the second ball screw nut, the second ball screw nut being rotatable.

In accordance with still another aspect, the bearing connection part may be an angular bearing.

In accordance with yet another aspect, a first driven pulley may be connected to one end of the ball screw shaft, and the first drive unit may include a first motor, a first drive pulley may be connected to the first motor, and a first power transmission belt may transmit power from the first drive pulley to the first driven pulley.

In accordance with yet another aspect, a second driven pulley may be fixed to the second ball screw nut to rotate with the second ball screw nut, and the second drive unit may include a second motor, a second drive pulley may be connected to the second motor, and a second power transmission belt may transmit power from the second drive pulley to the second driven pulley.

In accordance with yet another aspect, the second drive unit may be coupled with the second guide rail.

In accordance with yet another aspect, the substrate transfer apparatus may further include a base frame on which the first drive unit and the ball screw shaft are disposed, a reference rail may extend parallel to the ball screw shaft and be disposed on the base frame, and sliding parts may be provided on the first guide rail and the second guide rail to slide along the reference rail.

In accordance with still another aspect of the present invention, there may be provided a method of driving a substrate transfer apparatus that includes a first guide rail on which a first conveyor belt disposed on one side of a substrate is rotatably supported, a first ball screw nut fixed to the first guide rail, a ball screw shaft inserted into the first ball screw nut and rotatably engaging the first ball screw nut to move the first guide rail in an axial direction during rotation thereof, a second guide rail spaced from the first guide rail and on which a second conveyor belt disposed on another side of the substrate is rotatably supported, a second ball screw nut rotatably supported on the second guide rail and threadably engaging the ball screw shaft to move the second guide rail in an axial direction of the ball screw shaft when the ball screw shaft is rotated, a first drive unit connected to the ball screw shaft to rotate the ball screw shaft, and a second drive unit connected to the second ball screw nut to rotate the second ball screw nut. The method includes driving the first drive unit to rotate the ball screw shaft to concurrently move the first guide rail and the second guide rail, and driving the second drive unit to rotate the second ball screw nut to adjust a gap between the guide rails.

In accordance with another aspect, the driving the first drive unit may include stopping the second drive unit so that the second ball screw nut does not rotate.

In accordance with still another aspect, the driving the second drive unit may include stopping the first drive unit so that the ball screw shaft does not rotate.

In accordance with yet another aspect, when the second ball screw is rotated, the second guide rail may move in a direction toward the first guide rail or away from the first guide rail depending on a rotational direction of the second ball screw nut.

In accordance with yet another aspect, the first drive unit and the second drive unit may include belt drives rotating the ball screw shaft and the second ball screw nut, respectively.

BRIEF DESCRIPTION OF THE DRAWINGS

The foregoing aspects, and other objects, features and advantages of the invention will become more apparent from the following more particular description of possible examples of the invention and the accompanying drawings. The drawings are not necessarily to scale, emphasis instead being placed upon illustrating principles of the invention.

DETAILED DESCRIPTION OF THE INVENTION

The present invention will now be described more fully hereinafter with reference to the accompanying drawings, in which exemplary aspects of the invention are shown. This invention may, however, be embodied in different forms and should not be construed as limited to the aspects described and shown herein. Rather, these examples are provided so that this disclosure will be thorough and complete, and will fully convey the scope of the invention to those skilled in the art. Like numbers refer to like elements throughout the specification.

Figure 1:
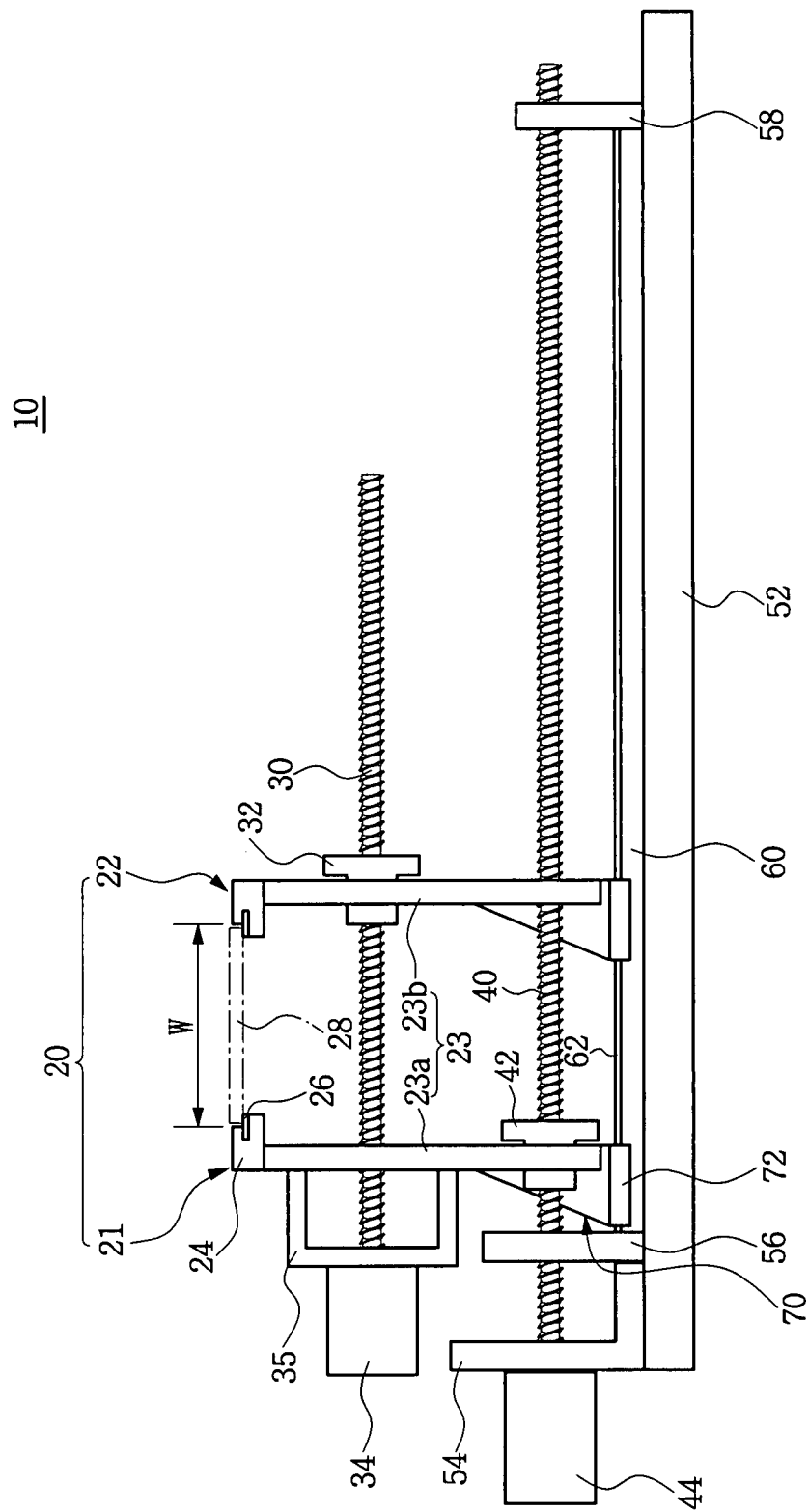
FIG. 1 is a schematic view showing components of a known substrate transfer apparatus.
Figure 2:
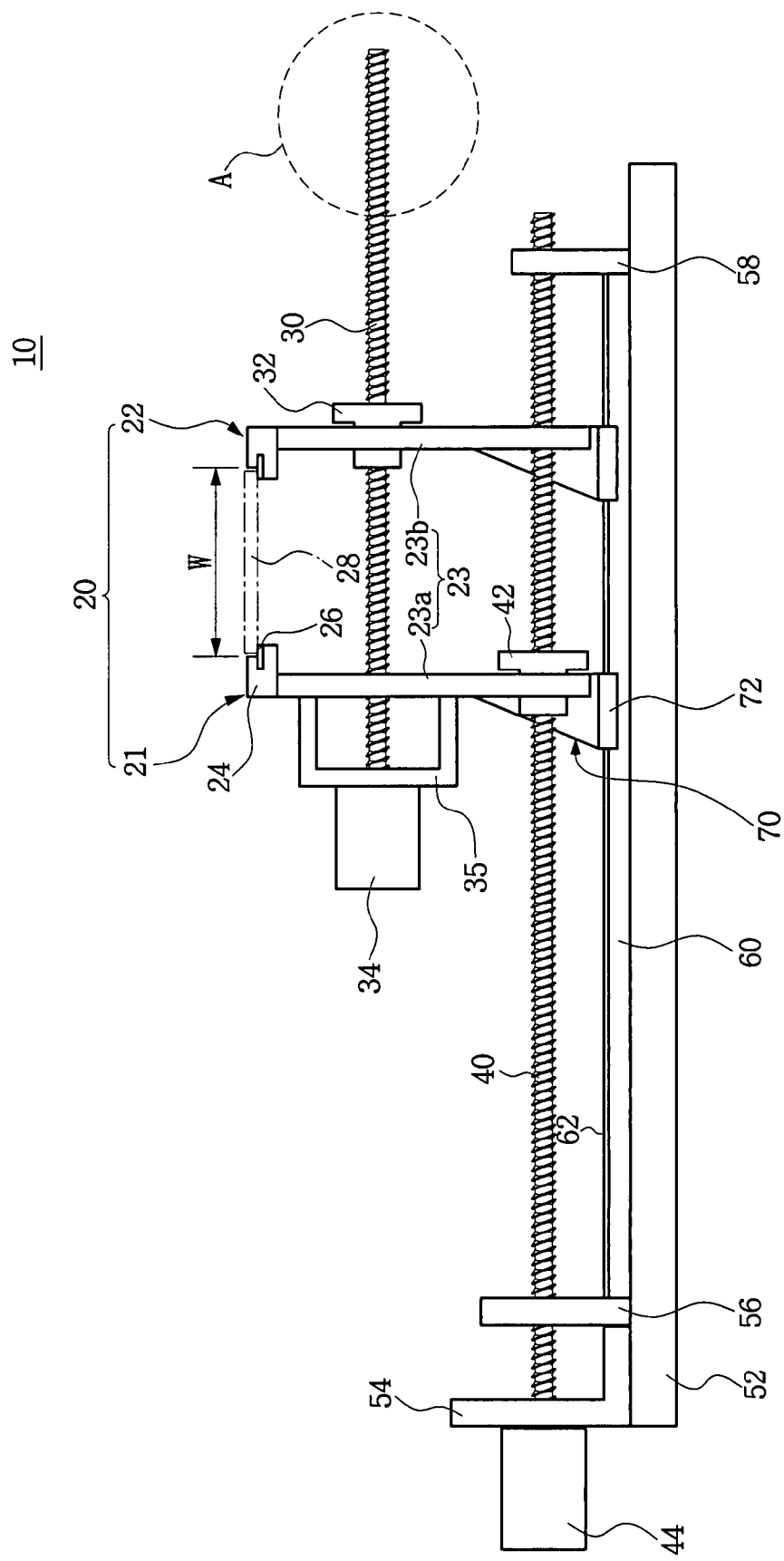
FIG. 2 is a schematic view of the known substrate transfer apparatus, in which a ball screw shaft projects from the apparatus due to movement and width adjustment of guide blocks.
Figure 3:
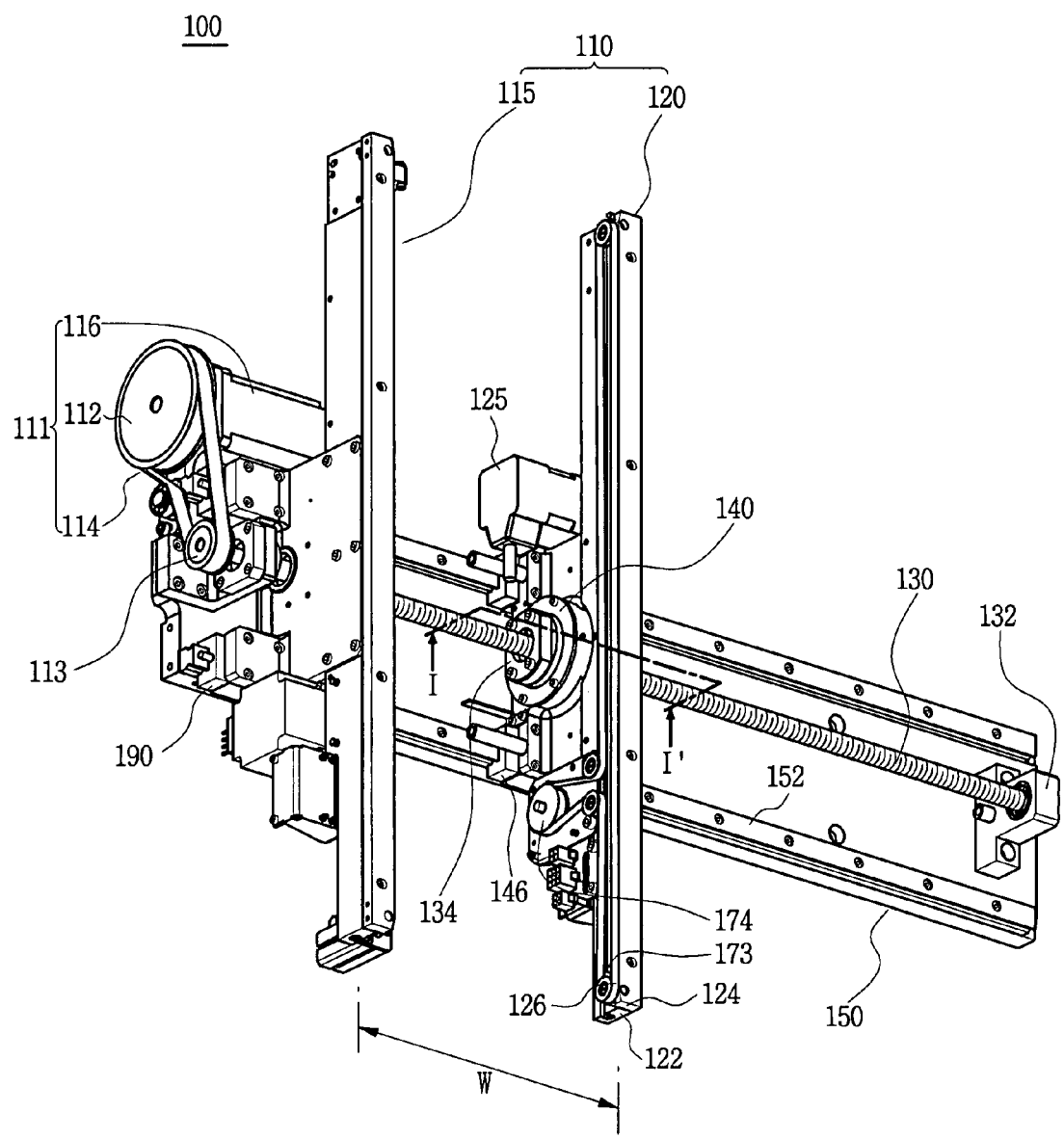
FIG. 3 is a perspective view of an exemplary substrate transfer apparatus illustrating some aspects of the present invention.
Figure 4:
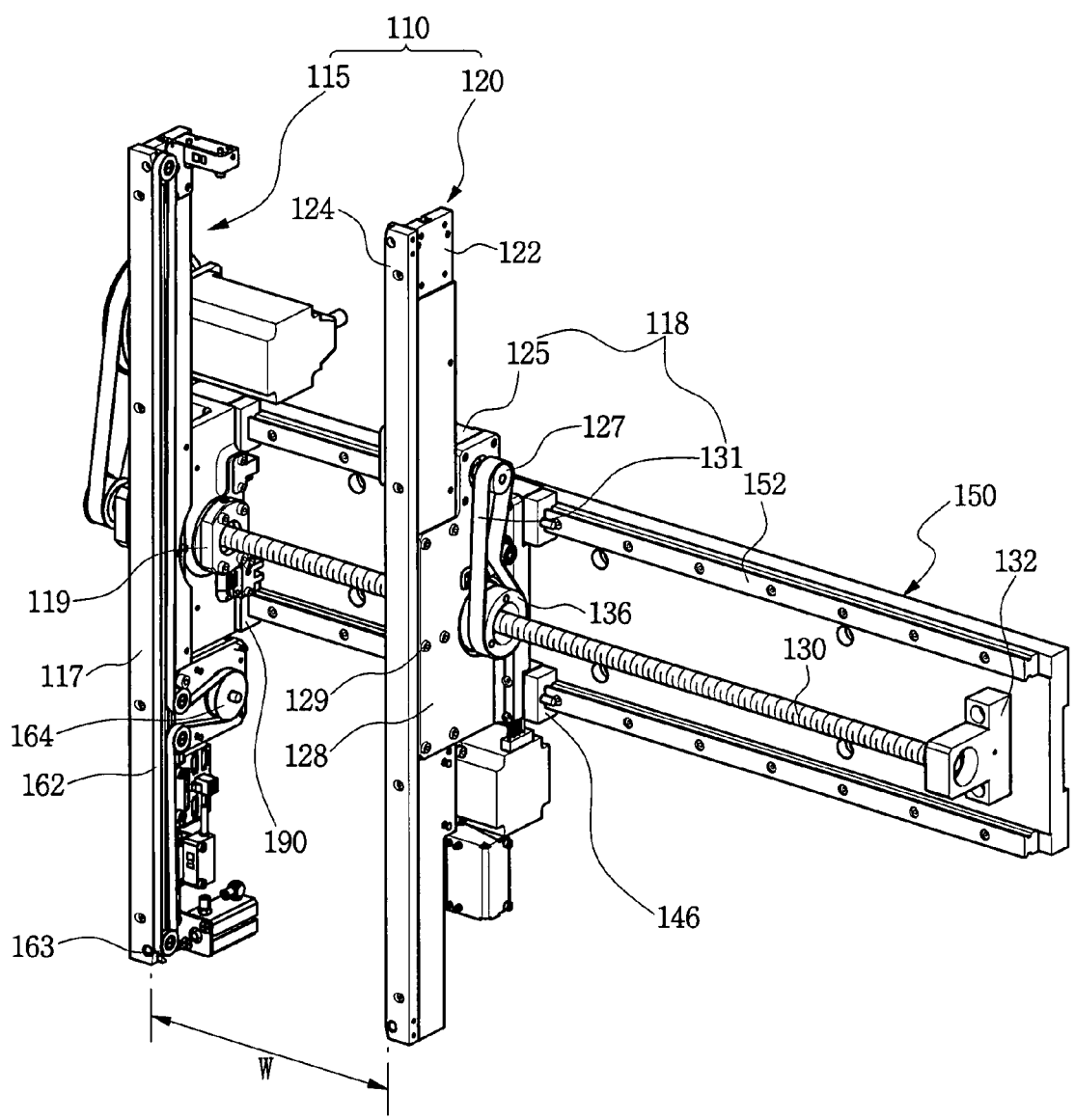
FIG. 4 is a perspective view of the exemplary substrate transfer apparatus of FIG. 3, when seen from an opposite side thereof.
Figure 5:
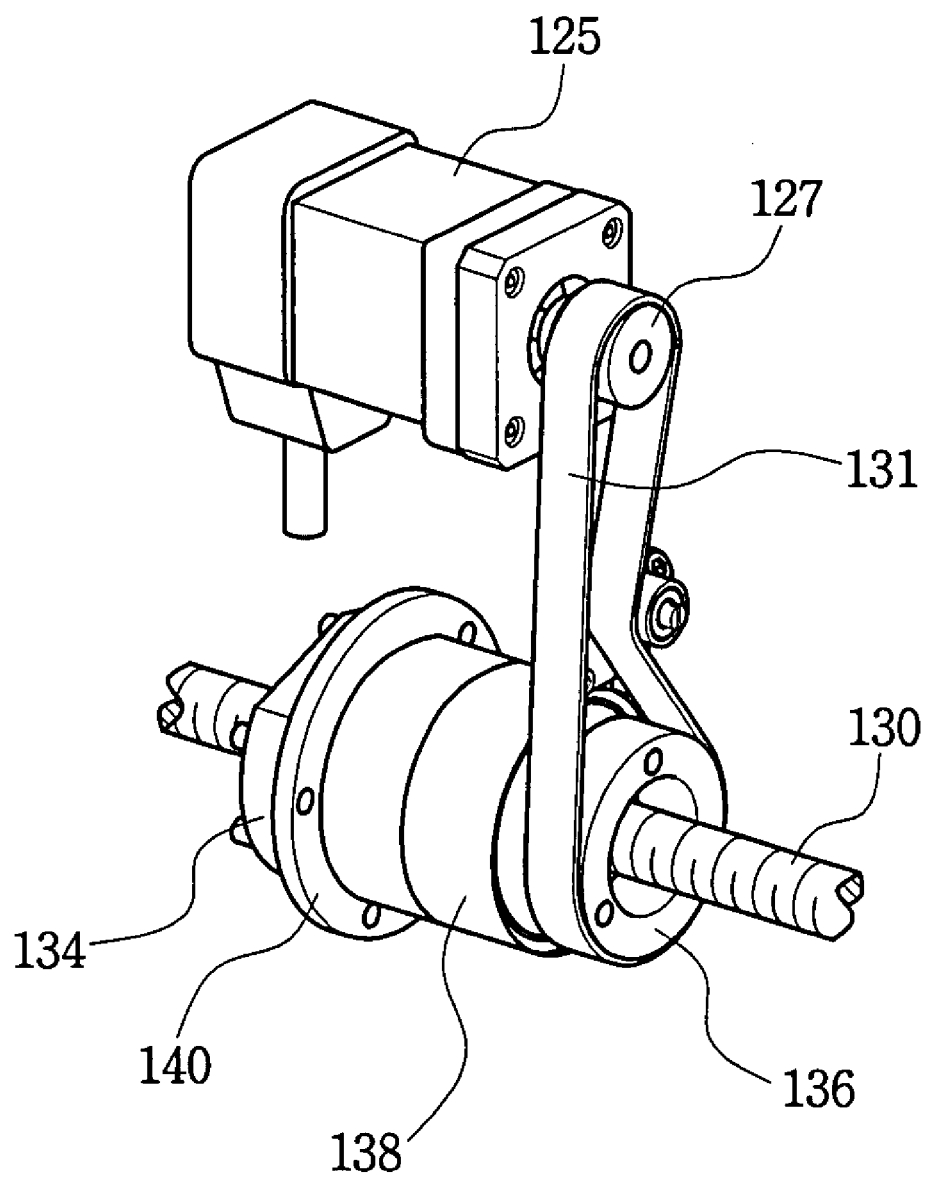
FIG. 5 is an enlarged perspective view showing components of a rotary part and a drive unit and interconnection thereof.
Figure 6:
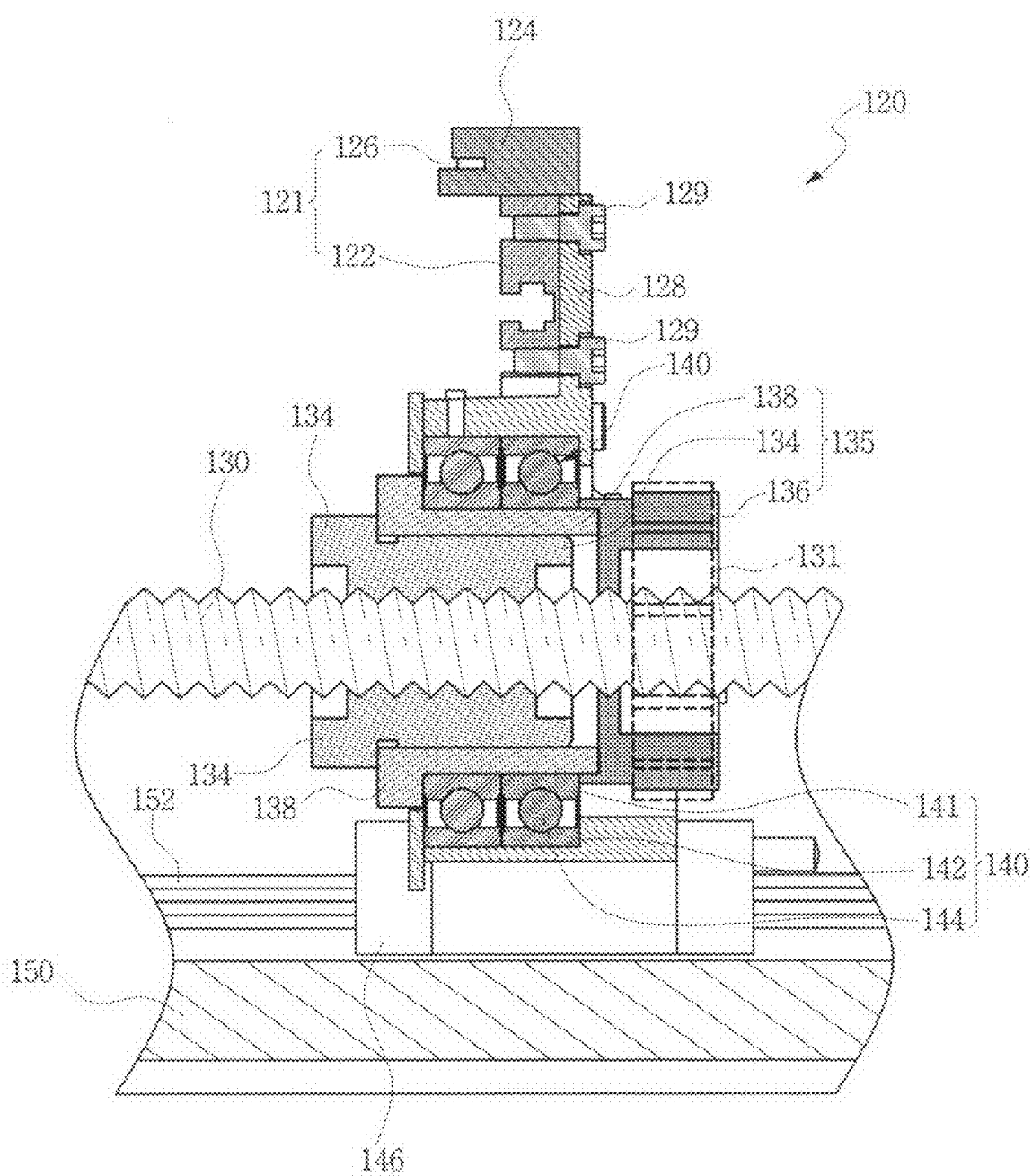
FIG. 6 is a cross-sectional view taken along line I-I' of FIG. 3, showing components of a second guide block.

FIG. 3 is a perspective view of an exemplary substrate transfer apparatus in accordance with some aspects of the present invention, FIG. 4 is a perspective view of the exemplary substrate transfer apparatus of FIG. 3, when seen from an opposite side thereof, FIG. 5 is an enlarged perspective view showing exemplary components of a rotary part and a drive unit and interconnection thereof, and FIG. 6 is a cross-sectional view taken along line I-I' of FIG. 3, showing exemplary components of a second guide block.

Hereinafter, an exemplary substrate transfer apparatus 100 in accordance with aspects of the present invention will be described with reference to FIGS. 3 to 6.

The exemplary substrate transfer apparatus 100 may be used in combination with a component mounting apparatus (not shown) to transfer a printed circuit board (hereinafter, referred to as a "substrate"), on which a component (not shown) is to be mounted at a component mounting position, and includes a pair of guide blocks 110, a ball screw shaft 130, a plurality of drive units 111 and 118, and a base frame 150.

More specifically, the guide blocks 110 may include a first guide block 115 and a second guide block 120, which are spaced from each other by a gap, for example, a gap corresponding to a width W of the substrate. Therefore, variation in the width W of the substrate, on which the component is to be mounted, causes variation in the gap between the guide blocks 110. Hereinafter, the first guide block 115 will be first described.

The first guide block 115 includes a first guide rail 117 that is rotatably supporting a first conveyor belt 162, on which one side of a substrate is disposed, a plurality of idle rollers 163 that are disposed on the first guide rail 117 to rotate the first conveyor belt 162 while maintaining a certain tension, a first drive roller 164 that is disposed on the first guide rail 117 to rotate the first conveyor belt 162, and a first ball screw nut 119 that is fixed to the first guide rail 117 to engage the ball screw shaft 130 such that a female threaded part threadably engages with a male threaded part formed on the ball screw shaft 130 to move the first guide rail 117 along the ball screw shaft 130 in an axial direction of the ball screw shaft 130 when the ball screw shaft 130 is rotated.

As they are used herein, the terms "ball screw shaft" and "ball screw nut" refer to a mechanical device for translating rotational motion to linear motion. A threaded shaft may provide a spiral raceway for ball bearings that are contained in a recirculating loop provided by the nut. Alternatively, a jackscrew (or leadscrew) or equivalent threaded shafts, and their corresponding threadably engaging nuts, may be substituted for the ball screw shaft and nuts.

In addition, a first sliding part 190 may be disposed at a lower part of the first guide rail 117 to slidingly engage a reference rail 152 of a base frame 150 and slide along the reference rail 152. Therefore, the first guide rail 117 is moved by operation of the ball screw shaft 130 and the first ball screw nut 119 due to rotation of the ball screw shaft 130, and is slid along the reference rail 152 by the first sliding part 190. The first ball screw nut 119 is fixed to the first guide rail 117, and the first guide rail 117 is slidingly engaged with the reference rail 152 of the base frame 150. Therefore, when the ball screw shaft 130 is rotated, the first ball screw nut 119 moves along the ball screw shaft 130, and is not rotated about the axis of the ball screw shaft 130.

The second guide block 120 may include a guide rail part 121 (see FIG. 6), a rotary part 135 (see FIG. 6) that is rotatable about the ball screw shaft 130, and a bearing connection part 140 (see FIG. 6) for connecting the guide rail part 121 to the rotary part 135 and allowing relative rotation of the rotary part 135 with respect to the guide rail part 121.

Referring to FIG. 6, the guide rail part 121 may include a second conveyor belt 126, a second guide rail 124, a first support frame 122, a second support frame 128, a connection bolt 129, a plurality of second idle rollers 173, and a second drive roller 174.

The guide rail 124 is disposed on the first support frame 122, and the first support frame 122 is fastened to the second support frame 128 by the connection bolt 129. In addition, the guide rail part 121 is connected to the bearing connection part 140 by the second support frame 128.

In addition, the second conveyor belt 126, on which the other side of the substrate is disposed, is rotatably supported on the second guide rail 124. The plurality of second guide rollers 173 are provided on the second guide rail 124 and function to support the second conveyor belt 126 such that the second conveyor belt 126 can be rotated with a certain tension. Further, the second drive roller 174 is provided on the second guide rail 124 to rotate the second conveyor belt 126.

The bearing connection part 140 connects the guide rail part 121 to the rotary part 135 such that the rotary part 135 can be rotated separately from the guide rail part 121. The bearing connection part 140 includes a first body 142, a second body 141, and balls 144 inserted between the bodies 142 and 141. Here, the bearing connection part 140 may be an angular bearing. The second body 141 may have a cylindrical shape with a smaller diameter that the first body 142. In addition, the balls 144 are disposed between the second body 141 and the first body 142 to be rolled depending on relative movement between the first body 142 and the second body 141.

As it is used herein, the term "angular bearing" may refer to an antifriction bearing that includes a roller or ball and that provides support for loading in both the radial and axial directions.

The rotary part 135 may include a second ball screw nut 134, a housing 138, and a second driven pulley 136 fixed for rotation with the second ball screw nut 134.

The second ball screw nut 134 has a female threaded part corresponding to a male threaded part formed on an outer periphery of the ball screw shaft 130. The second ball screw nut 134 is driven by engagement of the female threaded part with the male threaded part when the ball screw shaft 130 is rotated, thereby moving the ball screw nut 134 along the ball screw shaft 130 in an axial direction of the ball screw shaft 130. In addition, when the first ball screw nut 134 is rotated while not rotating the ball screw shaft 130, the female threaded part is driven with respect to the male threaded part to move the ball screw nut 134 in an axial direction along the ball screw shaft 130.

The housing 138 may have a hollow shape. An outer periphery of the housing 138 may be fixed to an outer periphery of the second body 141, and an inner periphery of the housing 138 may be fixed to an outer periphery of the second ball screw nut 134.

The second driven pulley 136 is fixedly connected to the housing 138, and directly connected to a second power transmission belt 131 of the second drive unit 118.

Further, the ball screw shaft 130 may pass through the rotary part 135. Specifically, the ball screw shaft 130 passes through the second ball screw nut 134 and the second driven pulley 136 of the rotary part 135, and threadably engages the second ball screw nut 134.

The ball screw shaft 130 is connected to the first driven pulley 113 at one end and is rotatably supported at the other end by the support frame 132 installed on the base frame 150. The other end of the ball screw shaft 130 may be supported by a ball bearing in the support frame 132. Therefore, the ball screw shaft 130 can be stably supported and rotated.

Referring to FIGS. 3 and 4, the pair of drive units include the first drive unit 111 and the second drive unit 118. The first drive unit 111 is disposed on the base frame 150 and may include a first motor 116, a first drive pulley 112 connected to the first motor 116, and a first power transmission belt 114 for transmitting power from the first drive pulley 112 to the first driven pulley 113. Therefore, the power of the first motor 116 is transmitted to one end of the ball screw shaft 130 through the first drive pulley 112, the first power transmission belt 114, and the first driven pulley 113, thereby rotating the ball screw shaft 130.

The second drive unit 118 is disposed on the guide rail part 121 and includes a second motor 125, a second drive pulley 127 connected to the second motor 125, and a second power transmission belt 131 for transmitting power from the second drive pulley 127 to the second driven pulley 136. The power of the second motor 125 is transmitted to the rotary part 135 through the second drive pulley 127, the second power transmission belt 131, and the second driven pulley 136, thereby rotating the rotary part 135. The second drive unit 118 may be fixedly supported on the second guide rail 124.

In addition, a second sliding part 146 may be fixedly connected to a lower part of the bearing connection part 140. The second sliding part 146 is fixed to a first body 142 of the bearing connection part 140. Therefore, the second sliding part 146 slidingly engages the reference rail 152 disposed on the base frame 150 so as to move along the reference rail 152. As a result, the second guide block 120 can move on the base frame 150.

The reference rail 152, on which the guide blocks 110 slide, may be disposed on the base frame 150, as are the first drive unit 111 and the ball screw shaft 130. The reference rail 152 is installed parallel to the ball screw shaft 130. One or more additional reference rails 152 may be disposed on either side of the ball screw shaft 130. In this case, additional sliding parts 146 and 190 may be provided for sliding along the corresponding reference rails 152.

Hereinafter, an exemplary method of driving a substrate transfer apparatus in accordance with an aspect of the present invention will be described in detail with reference to FIGS. 3 to 7.

Figure 7:
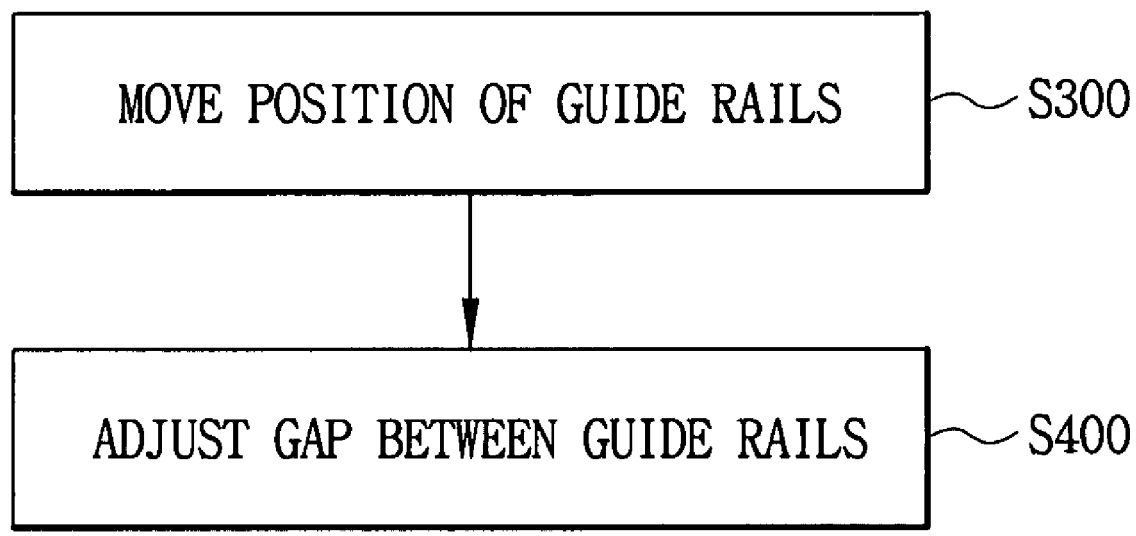
FIG. 7 is a block diagram illustrating an exemplary method of driving a substrate transfer apparatus in accordance with some aspects of the present invention.

Referring to FIG. 7, an exemplary method of driving a substrate transfer apparatus 100 includes a guide rail position moving step S300 of driving a first drive unit 111 to rotate a ball screw shaft 130 to concurrently move the first guide rail 117 and the second guide rail 124, and a guide rail gap adjusting step S400 of driving a second drive unit 118 to rotate the second ball screw nut 134 to adjust the gap W between the guide rails 117 and 124.

First, the guide rail position moving step S300 will be described in a state that the second drive unit 118 is not operated. The first motor 116 of the first drive unit 111 is operated to transmit power via the first drive pulley 112 and the first power transmission belt 114 to the first driven pulley 113. The ball screw shaft 130 is rotated depending on rotation of the first driven pulley 113.

Rotation of the ball screw shaft 130 moves the first ball screw nut 119 and the second ball screw nut 134, which are engaged with the male threaded part formed on the outer periphery of the ball screw shaft 130, along the ball screw shaft 130. As a result, guide blocks 110 connected to the first ball screw nut 119 and the second ball screw nut 134 are conveyed by the first ball screw nut 119 and the second ball screw nut 134 in an axial direction along the ball screw shaft 130 to concurrently move their positions. In this case, since the second drive unit 118 is not operated, the second ball screw nut 134 is braked so as not to rotate. As a result, the second ball screw nut 134 is moved along the ball screw shaft 130.

Next, the guide rail gap W adjustment step S400, which may be completed before or after position movement of the guide blocks 110, will be described when operation of the first drive unit 111 is stopped. Therefore, the ball screw shaft 130 is stopped so as not to rotate about a center axis thereof.

The second drive unit 118 operates a second motor 125 such that a rotational force of the second motor 125 is transmitted to the second driven pulley 136 via the second drive pulley 127 and the second power transmission belt 131. Therefore, when the second driven pulley 136 is rotated with the rotary part 135, the rotary part 135 and the bearing connection part 140 and the guide rail part 121 connected to the rotary part 135, i.e., the second guide block 120, is conveyed along the ball screw shaft 130. When the second ball screw nut 134 is rotated by rotation of the second driven pulley 136, the second guide rail 124 is displaced toward the first guide rail 117 or is displaced away from the first guide rail 117 depending on a rotational direction of the second ball screw nut 134, thereby adjusting the gap W between the guide rails 117 and 124.

The bearing connection part 140 is disposed between the rotary part 135 and the guide rail part 121. Therefore, the guide rail part 121 can be moved along the ball screw shaft 130 by the bearing connection part 140, regardless of rotation of the rotary part 135.

Therefore, the first guide block 115 of the guide blocks 110 is fixed and the second guide block 120 only moves to adjust the gap W between the guide rails 117 and 124, thereby adjusting the gap W to various sizes of substrates.

As can be seen from the foregoing, in a substrate transfer apparatus in accordance with the present invention, a plurality of guide blocks are connected to a single ball screw shaft to transfer a substrate, thereby making it possible to prevent the ball screw shaft from sagging and to overcome spatial restrictions of the known dual ball screw shaft structure.

In addition, it is possible to simplify the structure of the substrate transfer apparatus and reduce its weight, thereby reducing manufacturing cost.

Exemplary aspects of the present invention have been disclosed herein and, although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present invention as set forth in the following claims.

What is claimed is:

1. A substrate transfer apparatus comprising:
   a first guide rail on which a first conveyor belt is rotatably supported and at which one side of a substrate to be transferred is disposed;
   a first ball screw nut fixed with respect to the first guide rail;
   a ball screw shaft inserted into the first ball screw nut and rotatably disposed to move the first ball screw nut and the first guide rail in an axial direction of the ball screw shaft during rotation thereof;
   a second guide rail spaced apart from the first guide rail, on which a second conveyor belt is rotatably supported, and at which another side of the substrate to be transferred is disposed, the first conveyor belt and the second conveyor belt operable to transfer the substrate disposed thereon;
   a second ball screw nut rotatably supported on the second guide rail and operable to engage the ball screw shaft to move the second guide rail in the axial direction of the ball screw shaft when the ball screw shaft is rotated;
   a first drive unit connected to the ball screw shaft and operable to rotate the ball screw shaft; and
   a second drive unit connected to the second ball screw nut and operable to rotate the second ball screw nut.

2. The substrate transfer apparatus according to claim 1, further comprising:
   a bearing connection part disposed between the second guide rail and the second ball screw nut to connect the second guide rail with the second ball screw nut such that the second ball screw nut is rotatable with respect to the second guide rail.

3. The substrate transfer apparatus according to claim 2, wherein the bearing connection part comprises an angular bearing.

4. The substrate transfer apparatus according to claim 1, further comprising:
   a first driven pulley connected to one end of the ball screw shaft, wherein the first drive unit includes a first motor, a first drive pulley connected to the first motor, and a first power transmission belt operable to transmit power from the first drive pulley to the first driven pulley.

5. The substrate transfer apparatus according to claim 1, further comprising:
   a second driven pulley fixed to the second ball screw nut and operable to rotate with the second ball screw nut, wherein the second drive unit includes a second motor, a second drive pulley connected to the second motor, and a second power transmission belt operable to transmit power from the second drive pulley to the second driven pulley.

6. The substrate transfer apparatus according to claim 1, wherein the second drive unit is coupled with the second guide rail.

7. The substrate transfer apparatus according to claim 1, further comprising:
   a base frame on which the first drive unit and the ball screw shaft are supported;
   a reference rail disposed on the base frame and extending parallel to the ball screw shaft; and
   sliding parts provided on the first guide rail and the second guide rail to slide along the reference rail.

8. A method of driving a substrate transfer apparatus including a first guide rail on which a first conveyor belt is rotatably supported and at which one side of a substrate to be transferred is disposed; a first ball screw nut fixed to the first guide rail; a ball screw shaft inserted into the first ball screw nut and rotatably disposed to move the first ball screw nut and the first guide rail in an axial direction of the ball screw shaft during rotation thereof; a second guide rail spaced a predetermined gap from the first guide rail, on which a second conveyor belt is rotatably supported, and at which another side of the substrate to be transferred is disposed, the first conveyor belt and the second conveyor belt operable to transfer the substrate disposed thereon; a second ball screw nut rotatably disposed on the second guide rail and operable to engage the ball screw shaft to move the second guide rail in the axial direction of the ball screw shaft when the ball screw shaft is rotated; a first drive unit connected to the ball screw shaft and operable to rotate the ball screw shaft; and a second drive unit connected to the second ball screw nut and operable to rotate the second ball screw nut, the method comprising:
   driving the first drive unit connected to the ball screw shaft to rotate the ball screw shaft to thereby concurrently move the first guide rail and the second guide rail in the axial direction of the ball screw shaft by rotatably engaging the first ball screw nut fixed to the first guide rail and the second ball screw nut rotatably disposed on the second guide rail, respectively; and
   driving the second drive unit connected to the second ball screw nut rotatably disposed on the second guide rail to rotate the second ball screw nut and engage the ball screw shaft to thereby adjust a gap between the first and second guide rails.

9. The method according to claim 8, wherein the driving the first drive unit comprises stopping the second drive unit so that the second ball screw nut does not rotate.

10. The method according to claim 8, wherein the driving the second drive unit comprises stopping the first drive unit so that the ball screw shaft does not rotate.

11. The method according to claim 8, wherein the driving the second drive unit comprises rotating the second ball screw nut in a first direction to displace the second guide rail toward the first guide rail and rotating the second ball screw nut in a second direction to displace the second guide rail away from the first guide rail.

12. The method according to claim 8, wherein the driving the first drive unit and the driving the second drive unit comprise driving first and second belt drives to rotate the ball screw shaft and the second ball screw nut, respectively.

* * * * *